United States Patent [19]

Lewis et al.

[11] Patent Number: 5,705,022
[45] Date of Patent: Jan. 6, 1998

[54] CONTINUOUS LAMINATION OF ELECTRONIC STRUCTURES

[75] Inventors: David Andrew Lewis, Carmel; Alfred Viehbeck, Fishkill; Stanley Joseph Whitehair, Peekskill, all of N.Y.

[73] Assignee: International Business Machines Corporation, Armonk, N.Y.

[21] Appl. No.: 482,209

[22] Filed: Jun. 8, 1995

[51] Int. Cl.⁶ ............................................. B32B 31/20
[52] U.S. Cl. .................... 156/379.8; 156/275.5; 156/379.6; 156/555
[58] Field of Search ...................... 156/272.2, 273.3, 156/275.5, 379.6, 379.8, 380.8, 380.9, 555, 580, 583.1, 583.5

[56] References Cited

U.S. PATENT DOCUMENTS

| | | | |
|---|---|---|---|
| 3,619,325 | 11/1971 | Hair et al. | 156/583.1 |
| 3,655,488 | 4/1972 | Goldstein et al. | 156/380 |
| 3,711,365 | 1/1973 | Pyle | 156/273.3 X |
| 4,186,044 | 1/1980 | Bradley et al. | 156/273 |
| 4,402,778 | 9/1983 | Goldsworthy | 156/172 |
| 4,420,359 | 12/1983 | Goldsworthy | 156/379.8 |
| 4,456,498 | 6/1984 | Churchland | 156/275.5 |
| 4,747,897 | 5/1988 | Johnson | 156/148 |
| 4,803,022 | 2/1989 | Barrell et al. | 156/275.5 X |
| 5,146,058 | 9/1992 | Herfindahl et al. | 219/10.55 |
| 5,228,947 | 7/1993 | Churchland | 156/580.1 |

*Primary Examiner*—James Sells
*Attorney, Agent, or Firm*—Perman & Green, LLP

[57] ABSTRACT

A continuous process for the fabrication of metal clad, laminated core structures, such as circuit board cores, wherein the copper layers on the laminate are used to form a waveguide which propagates microwave or RF radiation in TEM mode down the length of the structure for heating the core layers while the necessary pressure is applied. The TEM mode offers substantial advantages in the uniformity and control of processing in this environment. In particular, the system may be made tunable using the positioning or two pinch points, produced by rollers applying pressure to consolidate the layered material, which points create end chokes defining a heating and pressure region wherein the radiation is reflected. Alternatively, the metal layers may also be used as capacitor-like plates for applying RF energy across the layered material.

21 Claims, 3 Drawing Sheets

CONTINUOUS LAMINATION OF ELECTRONIC STRUCTURES

BACKGROUND OF THE INVENTION

1. Field of the Invention

The present invention relates to the manufacture of metal coated, insulating substrates, such as used for printed circuits, and more particularly to a method and means for the continuous fabrication of cores or sublaminates for circuit boards and the like.

2. Problem to be Solved

One of the costliest challenges to printed circuit manufacture is the formation of the cores for the circuit boards. Printed circuit boards are currently manufactured by producing cores or sublaminates which consist of multiple layers or stacks of resin impregnated glass cloth to be clad with copper foil on both sides. These cores are patterned and laminated together with additional uncured laminate, under the simultaneous application of pressure and temperature, into the final board structure.

Presently, the second most expensive step in the manufacture of circuit boards, after inspection and test, is the fabrication of these cores. This is due to the fact that this step is carried out by hand laying-up the multilayer stacks and placing them in relatively small presses to form the cores. Thick cross-section composite material are joined for long periods at the joining temperature to ensure that the temperature at the center of the structure is the same as that at the outside. This process relies upon thermal conduction through the material, which conduction is extremely poor for polymers, hence the long time requirements. If thermal uniformity is not obtained, intermediate levels of curing, rather than full curing, may result providing less than optimal mechanical properties and electrical performance. For example, residual stresses may be established throughout the board which can potentially lead to delaminations or cracking in the field over long lifetimes.

Clearly, it would be desirable to reduce the process times required for this lamination cycle, as well as reducing the handling and power costs, and the space required for the processing. A continuous process would be the most desirable in achieving these goals. Since at the core fabrication stage of printed circuit manufacturing there is no alignment required between the various layers, the fabrication technique need not be very precise, so that it should not be difficult to carry out the process in a continuous manner using a moving web of core material. Also, the application of pressure to a moving web material is a comparatively simple procedure. Thus, the use of a web of laminated material should be quite suitable for continuous core production, except that a problem is posed when utilizing conventional heating with a continuous process. In such a situation the line length becomes overly long due to the high feed speeds necessary to produce the cores in the manufacturing environment. The application of microwave or other electromagnetic radiation, such as RF could be considered a viable heating technique for facilitating continuous fabrication, and a typical method would be to irradiate a web of the core material from the top (or bottom) of the sheet. However, the presence of the copper foil on the outer surfaces of the core at this stage of production presents a significant barrier. The penetration depth of microwave radiation in a metal such as copper is less than 1.5 $\mu$m, while the copper sheet is approximately 35 $\mu$m.

3. Prior Art

Turning to the prior art for various examples of approaches to the use of microwave or electromagnetic radiation in the treating of web materials the following patents were noted.

U.S. Pat. No. 5,146,058, to HERFINDAHL ET AL., relates to a method of heating and drying a continuous web of material, preferably an aramid fiber, using a rectangular microwave applicator, which contains two opposing faces with ferromagnets to contain the electric field. However, there is no showing of also providing pressure and this method is totally unsuitable for the processing of a web containing metal at the surface which acts as a shield to prevent the energy reaching the center of the core laminate.

U.S. Pat. No. 3,655,488, to GOLDSTEIN ET AL., discloses a method of joining two fabrics by the application of Radio Frequency (RF) radiation. One property of this radiation is that it is of a lower frequency, and thus longer wavelength, so that it can be applied to a workpiece via a pair of parallel plates, or electrodes, rather than the type of applicator necessary for microwave radiation, such as that described in above-noted U.S. Pat. No. 5,146,058. In the method described, an adhesive is applied as a monofilament between webs of cloth and is essentially melt processed, i.e., the glue is heated until it flows. Some pressure is applied, and as the material moves out of the work area, i.e., the area exposed to the radiation, the glue cools and forms a bond. If a metal foil were applied to these webs, the RF radiation would be prevented from penetrating the metal to reach the glue layer. Hence, this approach is not applicable to metallized materials.

U.S. Pat. No. 4,186,044, to BRADLEY ET AL., involves the continuous lamination of a honeycomb-centered, multilayer, resin impregnated structure using pressure and microwave radiation. One requirement of the process is that the center honeycomb be "non-metallic" (Col. 1, line 63), while the remaining layers are also non-metallic. Consequently, this method would not work with a metallic layer, e.g., a copper layer, since the penetration depth of the radiation would be too small in the presence of such a conductor as explained above.

U.S. Pat. No. 4,456,498, to M. T. CHURCHLAND, relates to a method using microwave radiation with the simultaneous application of pressure for the curing of wood based products. The disclosed method relies upon a single mode of radiation propagation to work. The radiation is directed to propagate through the wood and the presence of metal in the pressure application rollers is of little or no consequence, since other, non-conducting materials are capable of use as the source of pressure. In addition, because a single mode propagation is used, the dimensions of the product must be comparatively large—greater than 1 inch (=2.5 cm) for a dielectric constant of about 15 for wood. This constant is so high because of the high water content found in wood or any biological material. The conditions under which the microwave radiation is utilized here would not work with the thin core structure for which a continuous process is sought.

It will accordingly be seen that the prior art lacks a suitable teaching of how a continuous process to produce metal coated, insulating substrates, such as metal clad, thin laminated core structures, using the concurrent application of pressure and heating, particularly microwave heating, can be accomplished.

OBJECTS

It is therefore an object of the present invention to provide a solution to the problem of developing a continuous process to produce metal coated, insulating substrates or metal clad, laminated core structures, requiring the application of pressure and heating.

It is a further object of the invention to provide such a continuous process utilizing microwave or radio frequency (RF) radiation in producing the heating.

It is another object of the invention to specifically provide a method for the formation of printed circuit board cores, including the attachment of the copper foil, in a continuous manner.

SUMMARY OF THE INVENTION

The present invention involves a continuous process for the fabrication of metal coated, insulating substrates, which process is particularly suitable for use with metal clad, thin laminated core structures, such as circuit board cores, and wherein, when microwaves are applied, the layers of metal, e.g., copper, on the laminate are used to form a waveguide that propagates the microwave radiation along the core structure. Appropriate pressure application at selected pinch points causes reflection of the microwave energy creating a region for heating the core layers. The propagation mode of the radiation becomes a transverse Electric and Magnetic (TEM) mode. This type of mode is highly controllable, with no lower limit for the applicator dimensions, i.e., it allows the process to be applied to structures with very small dimensions. The maximum size is of the order of a wavelength in the material, about 1–3 cm, depending on the material. For example, for a material with a dielectric constant of about 7 it would be 2–3 cm, and becomes smaller as the dielectric constant increases. This mode offers substantial advantages in the uniformity and control of processing compared with other single or multimode systems. In particular, the system may be made tunable by varying the positioning of the pinch points, which apply pressure to consolidate the material. The system may even support the use of RF, rather than microwave, as the propagating energy, but preferably when RF is applied, the layers of metal on the laminate are used as electrodes between which an RF electric field is imposed along the length of the structure for heating the core layers.

Accordingly, the invention utilizes the metal cladding, preferably of copper, as an integral part of the electrical circuit to transfer the electromagnetic radiation into, and subsequently contain the electric fields within, the dielectric core that is being processed under pressure. This can be accomplished in a number of ways, depending on the wavelength of choice (microwave or RF).

DETAILED DESCRIPTION OF THE INVENTION

Figure 1:
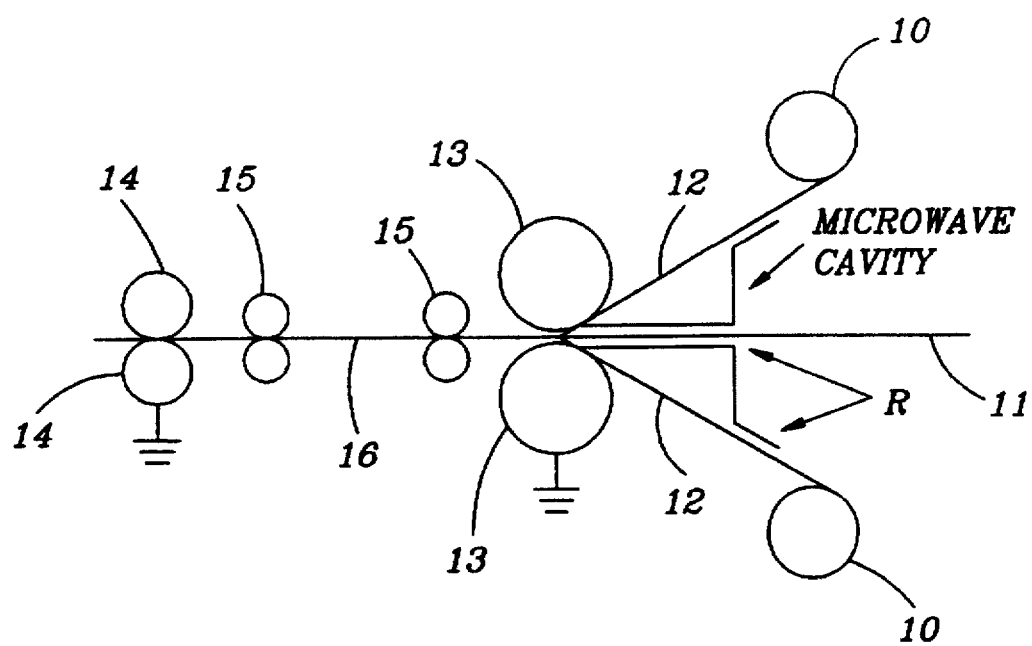
FIG. 1 is a diagrammatic illustration of a continuous system for producing metal clad laminated cores in accordance with the invention, wherein microwave radiation is end launched between the metal cladding which becomes part of the circuit forming a waveguide to transfer the radiation into and subsequently contain the electric fields within the dielectric core being processed under pressure.

The present invention provides a solution to the problem of developing a continuous process to produce metal coated, insulating substrates, and particularly metal clad, thin laminated core structures, requiring the concurrent application of pressure and heating, by utilizing microwave or radio frequency (RF) radiation in a manner which will couple well with the matrix material and have a very large penetration depth into the material. This latter feature results in the important ability to obtain very uniform temperature distributions throughout the cross-section of the material.

As discussed above, normally a problem is presented in applying microwave and RF radiation to internally heat metal clad structures in that the penetration depth of the radiation through the metal is too short so that direct heating of the core is prevented. For instance, for copper lines utilized in circuit boards, typically with thicknesses of 35 μm, the penetration depth is about 1.3 μm at 2.45 GHz (microwave) and 12.7 μm at 27 MHz (RF). Hence, the modification of known microwave lamination devices, such as described in above-cited U.S. Pat. No. 4,186,044, would not be practical because only the copper cladding would heat, and while eventually the heat would be transferred to the center of the laminate, the efficiency of direct radiation would be lost. Although RF processing is relatively well known in manufacturing applications such as wood ply adhesion to produce laminates, the application of this form of processing to electronics components, especially when metal cladding or wiring is utilized, appears heretofore to be unknown.

The invention overcomes the indicated problems and disadvantages by providing selected methods for the processing of metal clad cores in a continuous manner using either microwave or RF procedures for applying energy to or between the metal coating or cladding as part of the process. In particular, the solution involves utilizing the metal, preferably copper, cladding as an integral part of the electrical circuit to transfer the radiation into, and subsequently contain the electric fields within, the workpiece or dielectric laminate that is being processed.

In the case of microwaves, the layers of metal on the core or laminate are used to form a waveguide which propagates the microwave radiation down the length of the structure until reflected to create a resonant region for heating the core layers. The propagation mode of the radiation is a TEM mode which is highly controllable, with no lower limit for the applicator dimensions, i.e., it allows the process to be applied to structures with very small dimensions. With RF energy, while waveguide propagation is possible, the metal layers are preferably used as electrodes, like the plates of a capacitor, between which a high frequency RF electric field is created along the length of the structure for heating the core layers.

Accordingly, the invention can be implemented in various ways, depending on the wavelength of choice, microwave or RF. The microwave or RF procedure to be used is principally determined based on the wavelength with respect to the size of the structure, although the techniques for launching and propagating the energy can be different in each case. Heating with the higher frequency microwave radiation is much more efficient than with RF, and the wavelength is much smaller; but, RF is cheaper, easier to use, and a wider variety of structures can be used to provide uniform energy transfer. The manner in which these two forms of radiation can be applied to a material, especially a metal clad laminate structure, is significantly different with different utilization of the metal coating or cladding as part of the process. Key features of the structure in this regard are: (i) the geometry for supplying the microwave or RF power; (ii) the means for preventing the loss of radiation to the source of the metal cladding to avoid its becoming "live" and thereby limiting the radiation energy to the active process zone or region where it is required; and (iii) the means for permitting the application of microwave radiation to this process in a suitable manner, which those skilled in the art have not heretofore appreciated.

MICROWAVE

The microwave energy is applied in such a manner that the metal cladding acts as a waveguide for the radiation. A schematic illustrating the mode of operation is shown in FIG. 1, in which a microwave horn, antenna or other radiating device (not shown) directs microwave radiation R through the air between the metal cladding 12, supplied from rolls 10, and around the prepreg web 11, which can be multi-streams and is partially transparent to the microwave radiation R. The metal cladding 12 is pressed onto the web core 11 by means of pinch rollers 13. Since the impedance of the core material 11 beyond the rollers 13 is different from that of air, a transition is required to cause the radiation R to propagate within the core material. The characteristic impedance of air is 377Ω, and this transition can be created by setting the angles of the incoming copper cladding 12 precisely. Each angle can be varied and set by moving the copper cladding supply rolls 10 hydraulically until optimum transition is achieved. If a different launching mechanism (a horn, etc.) is used, the initial impedance may be different and appropriate adjustments can be made.

After transition, a TEM mode is established in the core material 11, bounded by the metal cladding 12. This mode is extremely versatile in that it is frequency independent so that even RF radiation may be utilized in the waveguide. However, as the frequency of the radiation decreases, more power is required to maintain the same heating effect and the penetration depth of the radiation in the metal cladding increases, hence, at some lower frequency, the metal cladding will start to heat more than the core material. Consequently, microwave radiation is normally preferred in this mode.

As seen in FIG. 1, a choke system is provided by positioning the set of opposing rollers 13, which extend the full width of the webbing 11, are grounded, and are in contact with the copper cladding 12, at the beginning of lamination to form a first choke at a point in web travel close to the copper supply rolls 10. The pinch of these rollers 13 may be adjusted to provide the desired pressure on the laminate during processing. A similar contact point at the other end of the process, defines a process region and involves another set of opposed pinch rollers 14, which can also apply pressure to the composite to assist the lamination process, thus acting as the second choke.

The process region, between the sets of pressure rollers 13 and 14, is the region in which most of the curing takes place. Both pressure and temperature are required to fully cure the laminate material and produce a final "core" material, consisting of the copper laminate on both sides of the glass and resin composite structure. It will be appreciated that pressure must be simultaneously applied to the cores during heat processing. This can be accomplished by the use of metal and polymer rollers, which act both to limit the travel of the radiation and to apply pressure. Thus, the sets of pinch rollers 13 and 14 will be of metal and grounded to limit the heating to the process region between them, as will be more fully explained, and to prevent the metal cladding beyond them from becoming "live". Sets of polymer rollers 15 may be disposed along the length of the process region to maintain the necessary pressure on the moving copper and dielectric laminate web 16.

Figure 2:
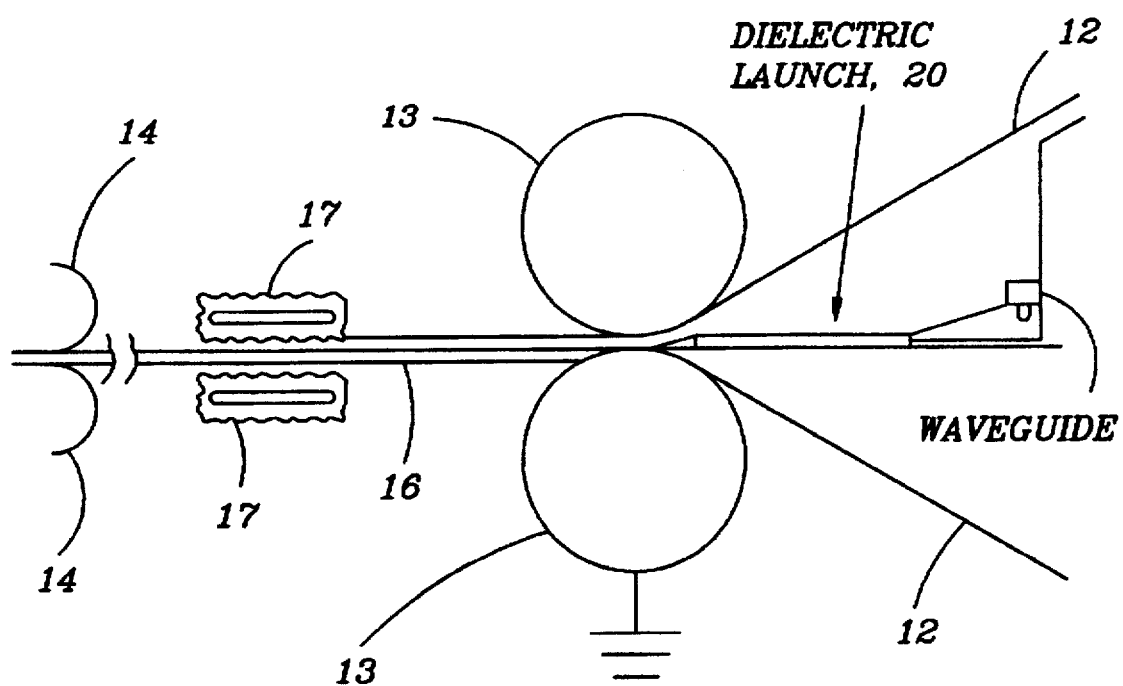
FIG. 2 is an enlarged view of the central portion of the system of FIG. 1 showing an alternative arrangement for introducing the microwaves into the dielectric core.

FIG. 2 shows a more detailed view of the dielectric launch structure 20 in combination with a microwave horn 21 which results in the directing of the microwave radiation between the metal cladding 12 into the dielectric core 11 for heating during processing. It is important to "define" the process length, i.e., the length of the process zone or region, which can be accomplished by appropriately locating the pinch rollers 14 with respect to rollers 13. The region between rollers 13 and rollers 14 becomes the waveguide structure where the web heating occurs. By adjusting the position of the rollers 14 and thus changing the size of the waveguide structure, the radiation may be effectively, although not always completely, reflected. An important factor in the propagation of electromagnetic radiation in a structure which is acting as a waveguide, such as the situation here, is the uniformity of the impedance. If an impedance mismatch is encountered, some fraction of the radiation will be reflected, depending on the size of the mismatch. The equation governing the impedance Z of a waveguide is:

$$Z = \text{square root}(\mu/\epsilon) \times (a/b)$$

where μ is the magnetic permeability (usually 1 for polymers), ε is the dielectric constant, a is the height (thickness) of the structure and b is the width. Hence, by compressing the structure using the pinch rollers 14, a change in the thickness a of the web and accordingly the impedance Z can be achieved, and the electric fields can be constrained. Consequently, by arranging two pinch rollers in a set with a suitable separation, and two such sets appropriately spaced from each other, a resonant zone or structure can be created by bounding the electric field on both sides causing reflection of the energy into the zone or region between the sets for heating the portion of the web passing therethrough.

A side launch of the radiation, as described below, could be used in this configuration and more than one set of pairs of pinch rollers and microwave sources can be utilized to provide the desired process profile. Additional auxiliary pressure sources, e.g., rollers 15 or caterpillar-style devices 17, can be used, provided that there is sufficient pressure differential between the auxiliary pressure devices and the confining rollers 13 and 14 to limit the processing region. Alternatively, the same limitation of the microwave energy can be obtained by releasing the pressure at a desired point, since such a release will cause an impedance mismatch resulting in energy reflection to concentrate heating in the desired zone.

Since the polymer dielectric acts as a waveguide, provided the circuit can be matched in reasonable fashion, multilevels of cores can be processed in a similar manner. This enables the final lamination to be carried out using this type of continuous processing, after the cores have been patterned, etc., preferably in a static mode. Some process control would be potentially lost in such case.

Figure 3:
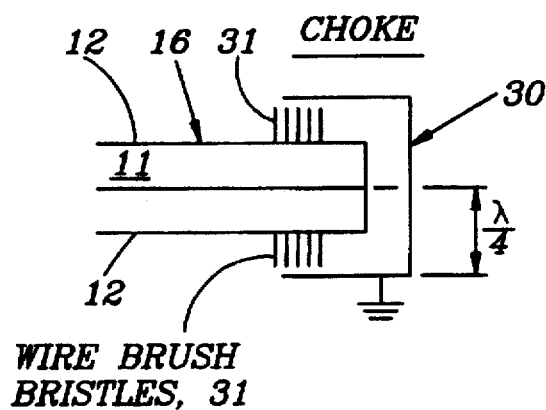
FIG. 3 illustrates one form of choke for sealing one edge of the core web against microwave leakage.
Figure 4:
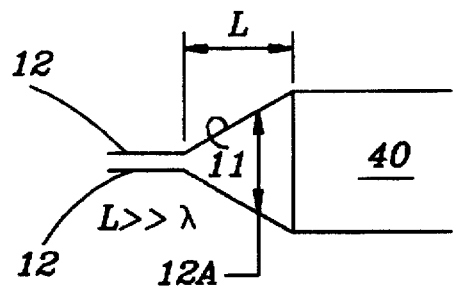
FIG 4 illustrates another form of choke for sealing one edge of the core web against microwave leakage.

In the structure as defined here, there is the possibility of leakage from the edges of the core structure during processing, which can result in unacceptable risk to processing personnel, and also result in the edges of the core laminate not being fully cured, causing a detraction of the yield. This leakage can be overcome by the utilization of a choke that is disposed at and along the edge of the metal and core web 16. Two forms of suitable chokes for this purpose are shown schematically in FIGS. 3 and 4. These structures illustrate two arrangements for preventing the radiation from leaking from the edges. The form of choke in FIG. 3, is a chamber-forming wire brush 30, preferably with stiff bristles 31, that encloses the edge of the web 16 and has the bristles 31 disposed in contact with the copper cladding 12 on both sides of the web core 11 to ensure that both sides are at the same electrical potential and are grounded. The size of the chamber created by the continuous grounding circuit should be ¼ of the wavelength of the radiation in the waveguide, resulting in a ¼ wave choke, as it is often called. In the FIG. 4 form of choke, the edges 12a of the copper cladding 12 are splayed extending past the glass/epoxy resin center of the core 11 by a distance L considerably greater than the wavelength $\lambda$ of the radiation. Also, a region of lossy material 40, such as ferrite, can be used to absorb stray radiation and prevent leakage. For this structure to act as an open circuit to prevent the escape of radiation, the impedance of this "transition" must simply not match that of free space, a relatively simple situation to achieve.

Figure 5:
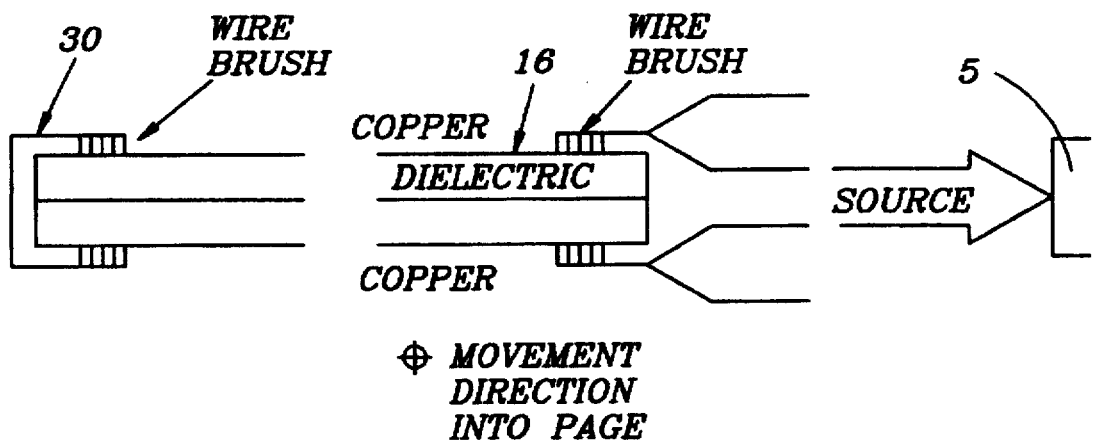
FIG. 5 illustrates one structural arrangement for side launching the microwaves between the metal cladding forming a waveguide in accordance with the invention.

Rather than utilizing the end launch of energy along the length of the web as already described with regard to FIGS. 1–4, a side launch technique can be used wherein the energy is launched across the width of the web. In applying the side launch method, as shown in the FIG. 5 configuration, one side or edge of the web structure 16 may be shorted by a wire brush 30 and grounding loop such as that in FIG. 3. The radiation then enters at the other side, e.g., through a structure analogous to than of FIG. 4 in which the splaying (12a) of the copper sheets 12 is controlled to provide an impedance match between the microwave launching device and the material 11 between the copper cladding 12. Here leakage is prevented by a wire brush arrangement provided between the guide structure and web surface. If there is no match, the radiation will be reflected back toward the source and not enter the material 11. There is typically a very narrow range of acceptable impedances.

Figure 6:
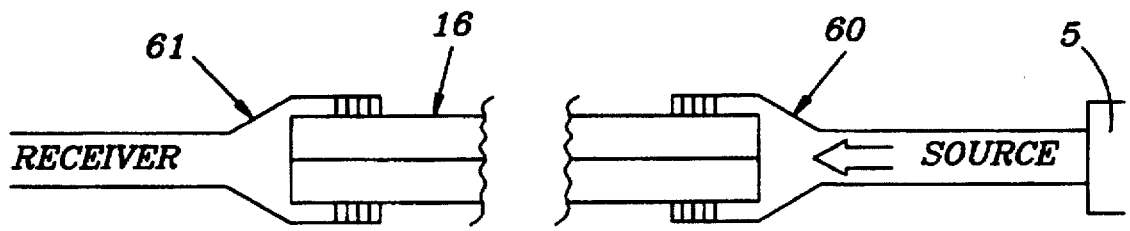
FIG. 6 illustrates an alternative structural arrangement for side launching the microwaves between the metal cladding forming a waveguide in accordance with the invention.

The structures described thus far (FIGS. 1–5) are all "resonant" devices since the radiation is reflected at some boundary. In addition to the reflection approach, the radiation may be terminated into a matched load (of the same impedance to reduce reflections) or be transmitted out of the structure to a receiver. One such structural arrangement is shown schematically in FIG. 6, wherein choke-like structures 60 and 61 are used respectively to couple the radiation into one side of the web structure 16 from a source and back out through the other side to a receiver. The main disadvantage of this type of arrangement is that the radiation is attenuated as it passes through the web structure 16, resulting in uneven heating across the parts in cases where the parts are very wide. However, non-uniformities due to standing waves established in the structure by reflected radiation can quite effectively be handled by varying the position of the choke and the effective width of the structure.

RADIO FREQUENCY ONLY APPLICATIONS

One advantage of RF radiation is that a pair of electrodes can successfully establish an electric field. For example, one of the metal cladding sheets 12 may be made the "active" electrode and the other is grounded to establish the field between these two metal layers and across the core laminates. The use of the same arrangement for the application of microwave radiation would result in the entire structure acting as an antenna, with essentially no electric field between the electrodes.

Figure 7:
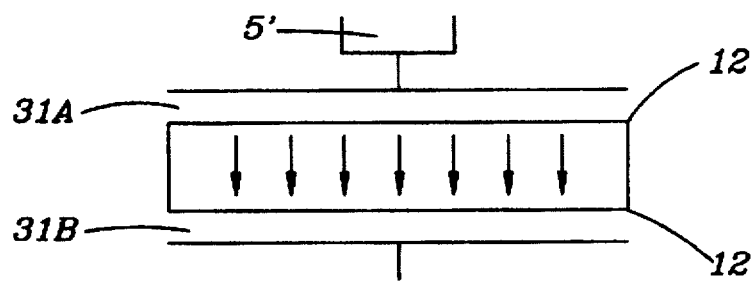
FIG. 7 illustrates an alternative embodiment utilizing RF radiation to create electric fields between the metal cladding to heat the core in accordance with the invention.

In a preferred embodiment, such as shown in FIG. 7, one metal cladding layer 12 becomes an electrode by being energized by an RF source S' through a wire brush (31a) type arrangement, such as described previously, while the other metal cladding is grounded, through a wire brush (31b). To contain the range of the radiation, the sets of pinch rollers, 13 and 14 (of FIG. 1), must be metal and be grounded. Without these rollers in place, the entire metal cladding 12 from the feed rolls 10 to the final station beyond rollers 14 would be "live" and cause heating of the material in between along the entire length of the cladding. This arrangement does not require choke structures at the edges of the moving web to prevent leakage, since the fields are contained by the geometry of the structure.

Figure 8:
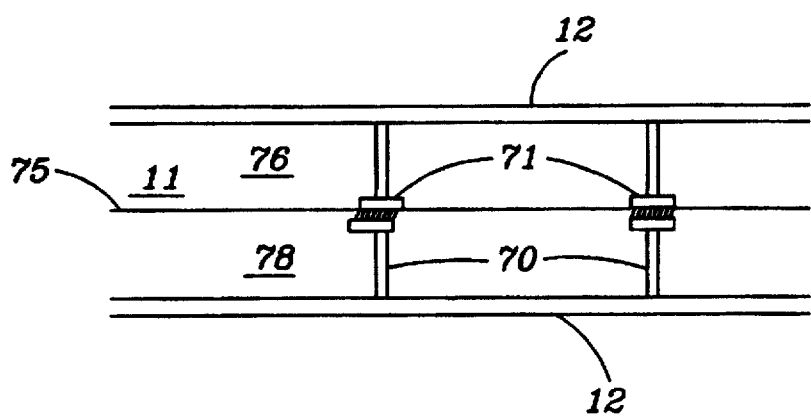
FIG. 8 illustrates an application of the present invention to joining two substrates having metal filled vias to form a laminate structure with metal to metal joints within the dielectric core.

In a further refinement of the process of the invention, metal to metal and polymer to polymer joints can be formed using such a process. This is illustrated more clearly in FIG. 8, which illustrates an application of the present invention to joining two substrates having metal filled vias to form a laminate structure with metal to metal joints within the dielectric core. As seen in the Figure, a composite structure, including two polymer substrates 76 and 78, each having outer conductor layers 12, are juxtaposed or arranged to form an inner interface 75 at which they are to be joined. Intermediate vias 70 are formed in each substrate, through the core 11, with joining metallurgy 71 in them contacting at the interface 75. In this case, the microwave radiation, applied using the geometry described above, will act to accelerate the formation of the polymer to polymer joining along the interface 75, and particularly the metal to metal bond, due to the high electric field strengths and the usually (relatively) poor conductivity of solders and similar joining metallurgies. This application is clearly more suitable for a static join, in which alignment is required to complete the structure, as opposed to the continuous processing described above. Also, it may be used in arrangements without the dielectric core 11.

It will accordingly be seen that the process of the invention significantly improves on prior art circuit board fabrication techniques, in a manner neither perceived nor contemplated by those of skill in the art. The mechanism of microwave and RF application, the use of the TEM mode for the processing, and the concept of using the product as the applicator is beyond the level of skill as evidenced by the prior art. Furthermore, the technique for controlling the processing and the tuning of the system by the positioning of nip rollers that apply the pressure to the product, is completely absent from the prior art.

What is claimed is:

1. Apparatus for producing continuous metal clad laminated core structures with the application of pressure and heating, comprising:

means for forming a continuous web structure by applying continuous metal sheets as metal layers to both sides of a continuous web of laminated core material;

means for forming a pressure and heat applying region;

means for moving said web structure through said pressure and heat applying region; and means for applying electromagnetic radiation to heat said laminated core material in said pressure and heat applying region; and wherein said means for forming a pressure and heat applying region comprises:
  a first set of opposing pinch rollers, disposed at the beginning of said pressure and heat applying region, for applying pressure to said moving web structure and forming a first choke for said electromagnetic radiation; and
  a second set of opposing pinch rollers, displaced along the path of movement of said web structure from said first set of opposing pinch rollers, and forming a second choke for said radiation at the other end of said pressure and heat applying region.

2. Apparatus as in claim 1 wherein said means for applying electromagnetic radiation comprises means for using said metal layers as waveguide plates for propagating said electromagnetic radiation through said laminated core material.

3. Apparatus as in claim 1 said means for applying electromagnetic radiation comprises means for applying microwave radiation propagating in the TEM mode.

4. Apparatus as in claim 1 further comprising choke means, disposed along the edge of said moving web structure in said pressure and heat applying region, for preventing radiation leakage from said edge.

5. Apparatus as in claim 1 wherein said first and second sets of opposing pinch rollers are of metal and grounded.

6. Apparatus as in claim 5 wherein said means for applying electromagnetic radiation comprises means for applying said radiation to said web structure along its edge between said metal layers.

7. Apparatus as in claim 6 wherein said means for applying said radiation to said web structure along its edge between said metal layers comprises:
  means for grounding the edges of said metal layers at one side of said web; and
  means for introducing said radiation between the edges of said metal layers on the opposite side of said web.

8. Apparatus as in claim 6 wherein said means for applying said radiation to said web structure along its edge between said metal layers comprises:
  first choke means for coupling said radiation between the edges of said metal layers into one side of said web from a radiation source; and
  second choke means for coupling said radiation between the edges of said metal layers out of the opposite side of said web to a radiation receiver.

9. Apparatus as in claim 5 wherein said means for forming a pressure and heat applying region further comprises non-metallic means for applying pressure to said web structure disposed between said first and second sets of opposing pinch rollers.

10. Apparatus as in claim 9 wherein said non-metallic means comprises at least one set of opposing pinch rollers of a polymer material, said polymer material pinch rollers passing said web structure therebetween.

11. Apparatus as in claim 1 further comprising means for setting the displacement of said first and second sets of opposing pinch rollers along the path of movement of said web structure to tune the electromagnetic radiation within said pressure and heating region.

12. Apparatus as in claim 1 further comprising means for setting the angles at which said continuous metal sheets are applied to both sides of said continuous web of laminated core material to control propagation of the radiation along the path of movement of said web structure within said pressure and heating region.

13. Apparatus as in claim 1 wherein said laminated core material comprises a plurality of layers of polymer having an interior interface to be joined.

14. Apparatus as in claim 13 wherein said laminated core material further comprises at least one pair of metallic vias with one of said vias extending between one of said metal layers and said interface to be joined and the other of said vias extending between the other of said metal layers and said interface to be joined.

15. Apparatus for producing continuous metal clad laminated core structures with the application of pressure and heating, comprising:
  means for forming a continuous web structure by applying continuous metal sheets as metal layers to both sides of a continuous web of laminated core material;
  means for forming a pressure and heat applying region;
  means for moving said web structure through said pressure and heat applying region; and
  means for applying RF electromagnetic radiation to heat said laminated core material in said pressure and heat applying region using said metal layers as circuit plates for propagating said RF electromagnetic radiation through said laminated core material, wherein one of said metal layers is connected as an electrode to a source of RF energy and the other of said metal layers is grounded to produce an RF field across said laminated core portion; and
  wherein said means for forming a pressure and heat applying region comprises:
    a first set of opposing pinch rollers, disposed at the beginning of said pressure and heat applying region, for applying pressure to said moving web structure and forming a first choke for said electromagnetic radiation; and
    a second set of opposing pinch rollers, displaced along the path of movement of said web structure from said first set of opposing pinch rollers, and forming a second choke for said radiation at the other end of said pressure and heat applying region.

16. Apparatus as in claim 15 wherein said means for applying RF electromagnetic radiation comprises means for applying said radiation to said web structure along its edge between said metal layers.

17. Apparatus as in claim 15 wherein said first and second sets of opposing pinch rollers are of metal and grounded.

18. Apparatus as in claim 17 wherein said means for forming a pressure and heat applying region further comprises non-metallic means for applying pressure to said web structure disposed between said first and second sets of opposing pinch rollers.

19. Apparatus as in claim 18 wherein said non-metallic means comprises at least one set of opposing pinch rollers of a polymer material, said polymer material pinch rollers passing said web structure therebetween.

20. Apparatus as in claim 15 wherein said laminated core material comprises a plurality of layers of polymer having an interior interface to be joined.

21. Apparatus as in claim 20 wherein said laminated core material further comprises at least one pair of metallic vias with one of said vias extending between one of said metal layers and said interface to be joined and the other of said vias extending between the other of said metal layers and said interface to be joined.

* * * * *